(12) United States Patent
Lojek (10) Patent No.: US 7,338,875 B2
(45) Date of Patent: Mar. 4, 2008

(54) METHOD OF FABRICATING A SEMICONDUCTOR DEVICE HAVING A TOROIDAL-LIKE JUNCTION

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/539,797

(22) Filed: Oct. 9, 2006

(65) Prior Publication Data

US 2007/0087557 A1 Apr. 19, 2007

Related U.S. Application Data

(62) Division of application No. 10/680,355, filed on Oct. 6, 2003, now Pat. No. 7,232,732.

(51) Int. Cl.
*H01L 21/331* (2006.01)

(52) U.S. Cl. ............... 438/364; 438/366; 438/368; 438/369; 257/E27.03

(58) Field of Classification Search ......... 438/364–377
See application file for complete search history.

(56) References Cited

U.S. PATENT DOCUMENTS 5,026,663 A 6/1991 Zdebel et al.
5,067,002 A 11/1991 Zdebel et al.
5,512,785 A 4/1996 Haver et al.

OTHER PUBLICATIONS

Wolf et al. "Silicon Processing for the VLSI Era" 1986, vol. 1, pp. 521-523.*

* cited by examiner

*Primary Examiner*—Thanh T. Nguyen
(74) *Attorney, Agent, or Firm*—Schneck & Schneck; Thomas Schneck (57) ABSTRACT

Formation of elements of a vertical bipolar transistor is described, in particular a vertical npn transistor formed on a p-type substrate. Accordingly, an improved method not limited by constraints of photolithography, and an ensuing device made by such methods, is described. A temporary spacer (e.g., an oxide spacer) is deposited over a dielectric separation layer. The temporary spacer and dielectric separation layers are then anisotropically etched, forming a dielectric "boot shape" on a lower edge of the dielectric separation layer. An area within this non-photolithographically produced boot region defines an emitter contact window. Since the boot tip is formed through deposition and etching techniques, the emitter window is automatically aligned (i.e., self-aligned) with an underlying base region. Feature sizes are determined by deposition and etching techniques. Consequently, photolithography of small features is eliminated.

12 Claims, 9 Drawing Sheets

METHOD OF FABRICATING A SEMICONDUCTOR DEVICE HAVING A TOROIDAL-LIKE JUNCTION

CROSS-REFERENCE TO RELATED APPLICATION

This is a divisional of application Ser. No. 10/680,355, filed Oct. 6, 2003, now U.S. Pat. No. 7,232,732 issued Jun. 19, 2007.

TECHNICAL FIELD

This invention relates generally to a process for fabricating an integrated circuit structure, and more specifically to electronic devices having semiconductor junctions and to a process for their manufacture.

BACKGROUND ART

There is a need in the integrated circuit art for obtaining increasingly smaller devices without sacrificing device performance. The small device size requires small device regions, precise and accurate alignment between regions and minimization of parasitic resistances and capacitances. Device size can be reduced by putting more reliance on fine line lithography, but as discussed below, it becomes impractical or impossible to continue to reduce feature size and achieve the required greater increase in alignment accuracy. As lithography is pushed to the limit, yield and production throughput decrease.

Four governing performance parameters of a photolithographic system are limit-of-resolution, $L_r$, level-to-level alignment accuracy, and depth-of-focus, and throughput. For purposes of this discussion, limit-of-resolution, level-to-level alignment, and depth-of-focus are physically constrained parameters.

Typical photolithographic techniques are limited by physical constraints of the photolithographic system involving actinic radiation wavelength, $\lambda$, and geometrical configurations of the projection system optics. According to Rayleigh's criterion, $$L_r = \frac{0.61\lambda}{NA}$$

where NA is the numerical aperture of the optical system and is defined as NA=n sin α, where n is the index of refraction of the medium which the radiation traverses (usually air for this application, so n≅1) and α is a half-angle of the divergence of the actinic radiation. For example, using deep ultraviolet illumination (DUV) with $\lambda$=193 nm, and NA=0.7, the lower limit of resolution is 168 nanometers (1680 Å). Techniques such as phase-shifted masks can extend this limit downward, but photomasks required in this technique are extremely expensive. This expense becomes greatly compounded with a realization that an advanced semiconductor process may employ more than 25 photomasks.

Along witch the limit-of-resolution, the second parameter, level-to-level alignment accuracy becomes more critical as feature sizes on photomasks decrease and a number of total photomasks increases. For example, if photomask alignment by itself causes a reduction in device yield to 95% per layer, then 25 layers of photomask translates to a total device yield of $0.95^{25}$=0.28 or 28% yield (assuming independent errors). Therefore, a more complicated mask, such a phase-shifted mask is not only more expensive but device yield can suffer dramatically.

Further, although the numerical aperture of the photolithographic system may be increased to lower the limit-of-resolution, the third parameter, depth-of-focus, will suffer as a result. Depth-of-focus is inversely proportional to $NA^2$. Therefore, as NA increases, limit-of-resolution decreases but depth-of-focus decreases more rapidly. The reduced depth-of-focus makes accurate focusing more difficult especially on non-planar features such as "Manhattan Geometries" becoming increasingly popular in advanced semiconductor devices.

Recently, techniques have been developed to make smaller scale transistors and related devices. One such method of making transistors is described in U.S. Pat. No. 5,067,022 to Zdebel et al., assigned to Motorola, Inc. Here, a process is disclosed for fabricating improved integrated circuit devices. In accordance with one embodiment of the invention integrated devices are fabricated by a process which produces small device areas without relying upon restrictive photolithography tolerances. The process uses four polycrystalline silicon layers to fabricate and contact the device regions, achieve a relatively planar structure, and to reduce the size of device regions below normal photolithographic tolerances. The process uses a master mask to define the basic footprint of the device in combination with easy to align block-out masks in each lithography step. However, that process is still limited by requiring large implant areas. For example, a bipolar transistor base region still requires photomasks and photolithographic techniques for its production. An integrated circuit device, or even a single transistor or other electronic device fabricated by this method cannot be scaled down beyond a given point. Further, a high base-emitter capacitance resulting from use of this method severely affects device performance.

Additionally, in a conventional method for fabricating a bipolar device, an emitter window is directly opened without some means of providing an etch stop. This overetch produces a damaged region in the silicon and may result in excessive consumption of silicon underlying the contact. Further, formation of an oxide spacer without an etch stop presents manufacturing difficulties as timing and other recipe tolerances become overly stringent.

For at least the aforementioned reasons, integrated circuit manufacturers have been unable to sufficiently reduce a size of electronic devices while still maintaining high performance. In view of the desire for integrated circuits having higher device counts, smaller device sizes, and greater circuit performance, a need continues to exist for an improved process to manufacture the required devices without resorting to unrealistic and expensive photolithography requirements.

Accordingly, what is needed is a way to provide an improved process and structure for fabricating integrated circuit devices. Such a structure for producing integrated circuit devices would have devices with a reduced size with reasonable photolithographic tolerances.

DISCLOSURE OF THE INVENTION

Formation of elements of a vertical bipolar transistor is described, in particular a vertical npn transistor formed on a p-type substrate. Vertical npn transistors are much used in the integrated circuit art. Accordingly, improved means and methods for their formation, which are not limited by constraints of photolithography have great utility and importance. Those of skill in the art will appreciate that the conductivity types shown herein may be reversed if it is desired to form a vertical pnp transistor on an N-type substrate. Additionally, the same techniques may be used to fabricate other types of devices. For example, a gate-source junction (as well as other device junction types) may be fabricated using the methods described herein.

In one embodiment, the present invention includes a method of fabricating an electronic device comprising forming a slot region for a doped polycrystalline silicon plug material within an outer periphery of an etched window region. The window region is formed by etching a film stack residing on a topmost surface of a semiconductor substrate having a p-type conductivity. The slot region is then filled with the polycrystalline silicon plug material, followed by depositing a dielectric separation layer over the polycrystalline silicon plug material. A dopant, for example, boron, is implanted into a limited area of the substrate located within a region circumscribed by the slot region. A temporary spacer (e.g., an oxide spacer) is deposited over the dielectric separation layer. The temporary spacer and dielectric separation layers are then anisotropically etched, forming a dielectric "boot shape" on a lower edge of the dielectric separation layer. The boot shape is indicative of a projection of a dielectric layer extending radially inward (see FIG. 15, element 1501). An area within this non-photolithographically produced boot region defines an emitter contact window. Since the boot tip is formed through deposition and etching techniques, the emitter window is automatically aligned, (i.e., self-aligned) with an underlying base region. Therefore, level-to-level alignment issues with multiple masks are eliminated. Additionally, feature sizes are also determined by deposition and etching techniques. Consequently, photolithography of small features is eliminated. Thus, limit-of-resolution and depth-of-focus are unimportant parameters.

During an anneal cycle, the dopant from a lower edge at the polycrystalline silicon plug is driven into the substrate, forming a toroidal-like junction with low capacitance. The toroidal-like junction, in three-dimensions, is similar to a toroid shape but radial symmetry is not necessary. For example, a toroid is a surface generated by a plane-closed curve rotated about a line that lies in the same plane as the curve but does not intersect it. The toroidal-like junction of the present invention may take a form of a closed shape not necessarily rotated equidistantly from an imaginary line.

Finally, any remaining film layers within a region substantially circumscribed by the dielectric boot are etched down to the topmost surface of the substrate; and an emitter polycrystalline silicon layer is deposited.

The present invention is also an electronic device. In one embodiment, the electronic device comprises a semiconductor substrate having thereon at least one region laterally enclosed by a dielectric isolation region and coupled to a principal surface of the substrate. A polycrystalline silicon plug region is peripherally disposed on an outermost boundary of the dielectric isolation region and coupled to the dielectric isolation region. The polycrystalline silicon plug region is further electrically coupled to the semiconductor substrate. A doped region extends from the polycrystalline silicon plug region distally into the substrate and is electrically coupled to said polycrystalline silicon plug region. A doping concentration of the doped region has a toroidal-like topology.

MODES FOR CARRYING OUT INVENTION

Figure 1:
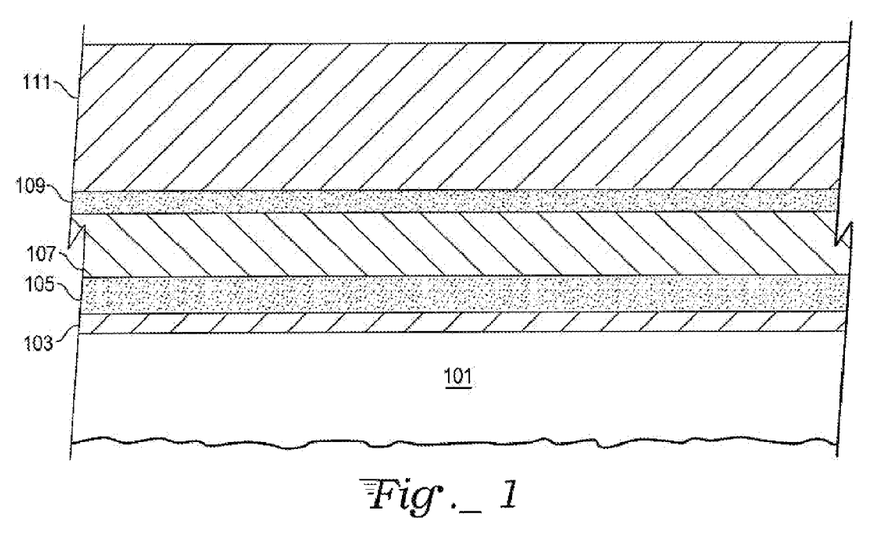
FIG. 1 shows an exemplary embodiment of a schematic cross-sectional view of deposited films used to create an electronic device structure.

With reference to FIGS. 1-18, an exemplary embodiment of the present invention is described in detail according to the following process steps. To start, FIG. 1 shows an exemplary embodiment of a cross-sectional view of deposited films used to form an electronic device structure. Each film layer is deposited in compliance with process steps that are well-known in the semiconductor art. FIG. 1 includes a base substrate 101, a pad oxide 103, a first nitride layer 105, a first polycrystalline silicon ("poly") layer 107, a second nitride layer 109, and an isolation oxide 111.

In a specific exemplary embodiment, nominal film thicknesses and methods of deposit are provided as follows; the pad oxide is a thermally grown 400 Å oxide, the first nitride is 1000 Å thick, the first poly is 1800 Å thick, the second nitride layer is 700 Å thick, and the isolation oxide is 7000 Å thick, deposited by a plasma-enhanced chemical vapor deposition (PECVD) process.

The base substrate 101 is frequently a silicon wafer. In this embodiment, the specific silicon wafer is doped as a p-type substrate. Alternatively, another semiconductor may be selected for base substrate 101.

Figure 2:
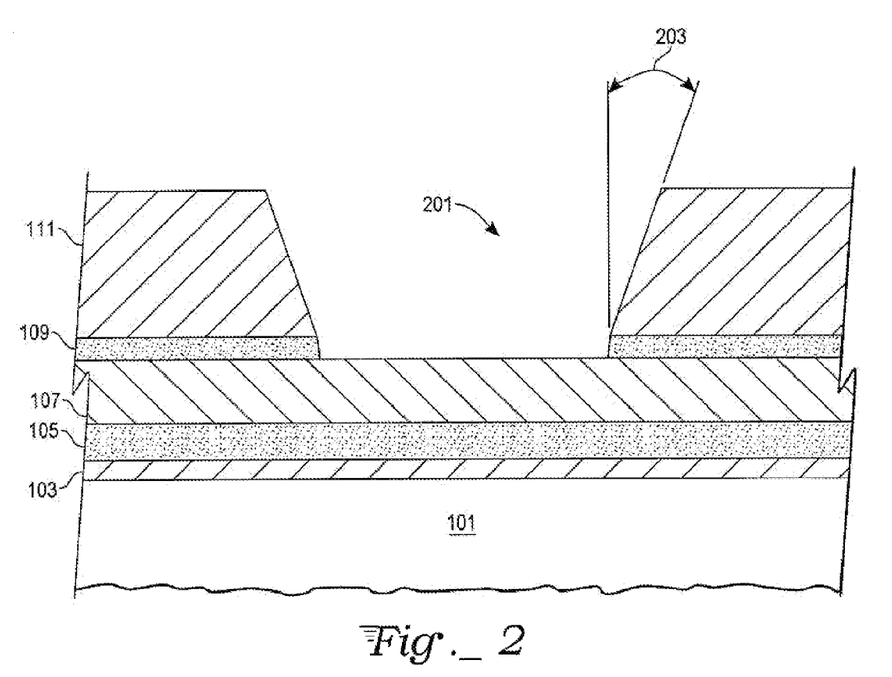
FIG. 2 shows the deposited films of FIG. 1 with an etched dielectric area 201.

FIG. 2 shows the deposited films of FIG. 1 with an etched dielectric area 201. Etching may be accomplished through various wet etch (e.g., in hydrofluoric, such as contained in a standard buffered oxide etch, or orthophosphoric acid) or dry etch (e.g., reactive-ion etch (RIE)) techniques. An edge wall angle 203 will depend on several factors such as a size of the etched dielectric area 201 and type of etchant used.

Figure 3:
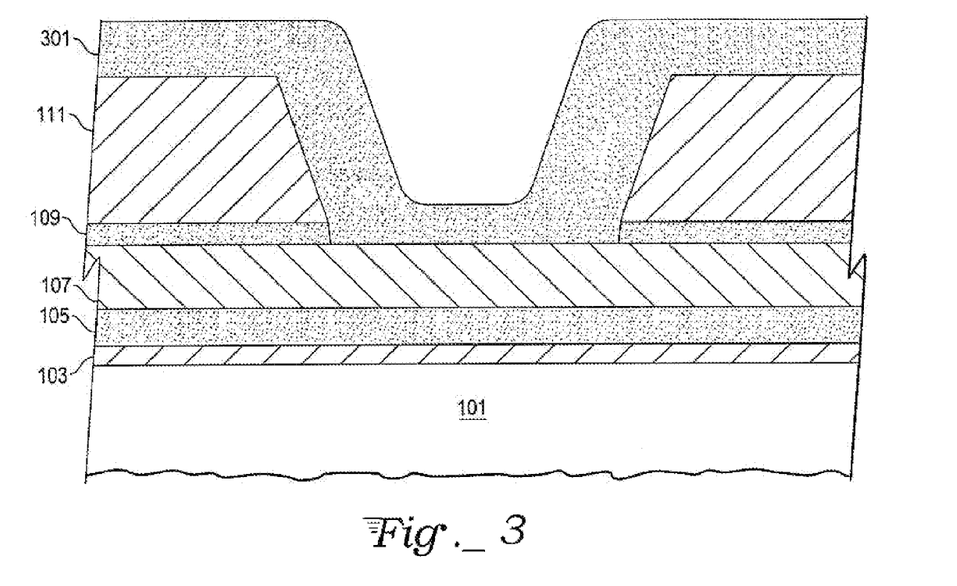
FIG. 3 shows a conformal blanket deposition of a third nitride layer.
Figure 4:
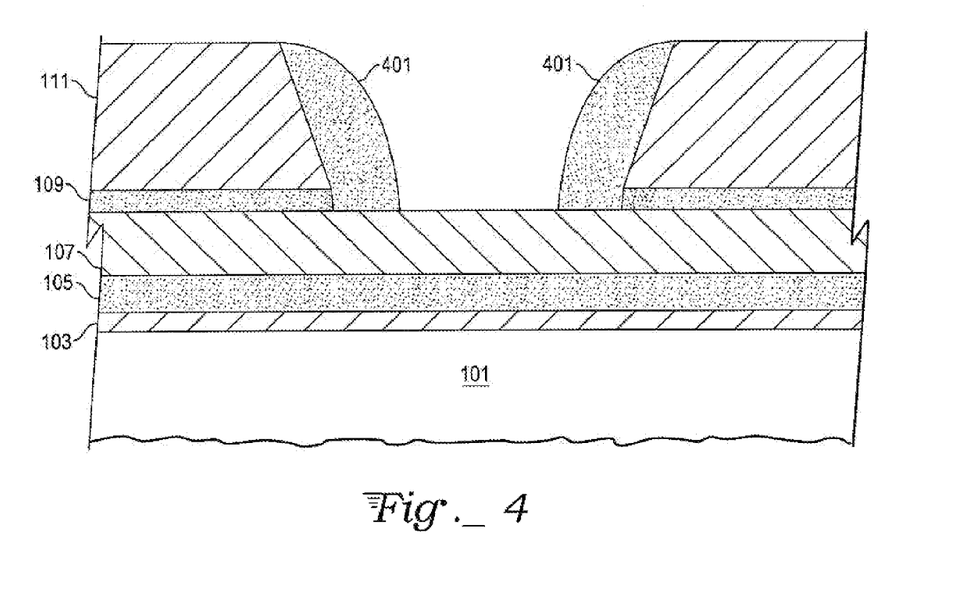
FIG. 4 shows the third nitride layer of FIG. 3 anisotropically etched.

FIG. 3 shows a conformal blanket deposition of a third nitride layer 301. The third nitride layer 301 is used as a mask for later oxidation steps (described infra). FIG. 4 shows the third nitride layer anisotropically etched 401 to a top of the first poly layer 107. Nitride can be anisotropically etched, for example, by RIE. A high selectivity to either silicon or silicon dioxide is accomplished using $CHF_3/O_2$, $CH_2F_2$, or $CH_3F$.

Figure 5:
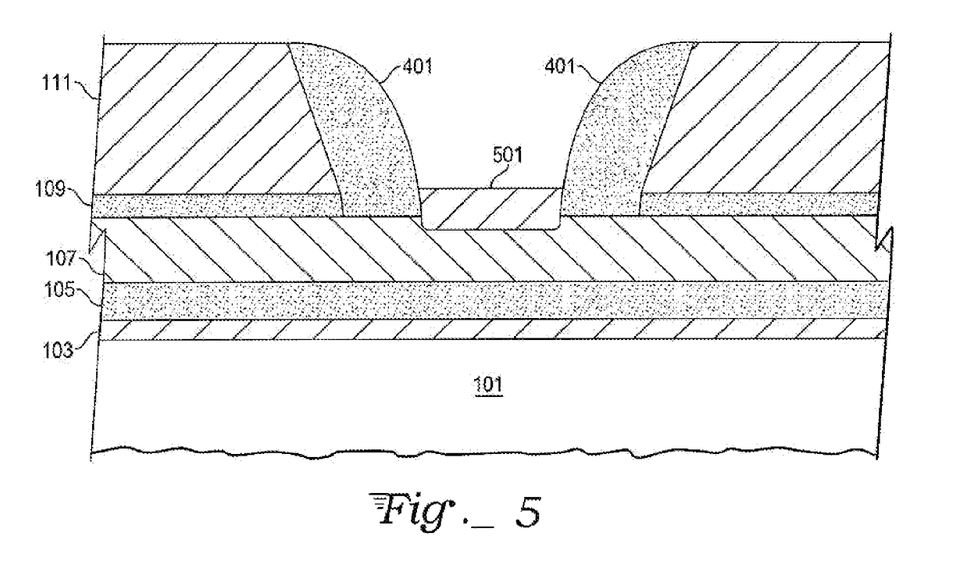
FIG. 5 shows a thermally grown oxide within the confines created by the etched nitride layer of FIG. 4.

A thermally grown oxide 501 in FIG. 5 serves as a mask for the underlying poly 107, nitride 105, and oxide 103 layers. Ideally, the thermally grown oxide 501 is substantially thicker than the underlying pad oxide 103 to prevent the thermally grown oxide 511 from being completely etched prior to etching through the pad oxide 103 in later steps. Thermal growth techniques combine oxygen with underlying silicon (i.e., the polycrystalline silicon 107). Mechanisms for thermal oxide growth are well understood with 44% of the underlying poly 107 being consumed to form the oxide 501. Alternatively, oxide 501 could be deposited. Next, the remainder of the etched nitride layer 401 is removed as shown in FIG. 6.

Figure 6:
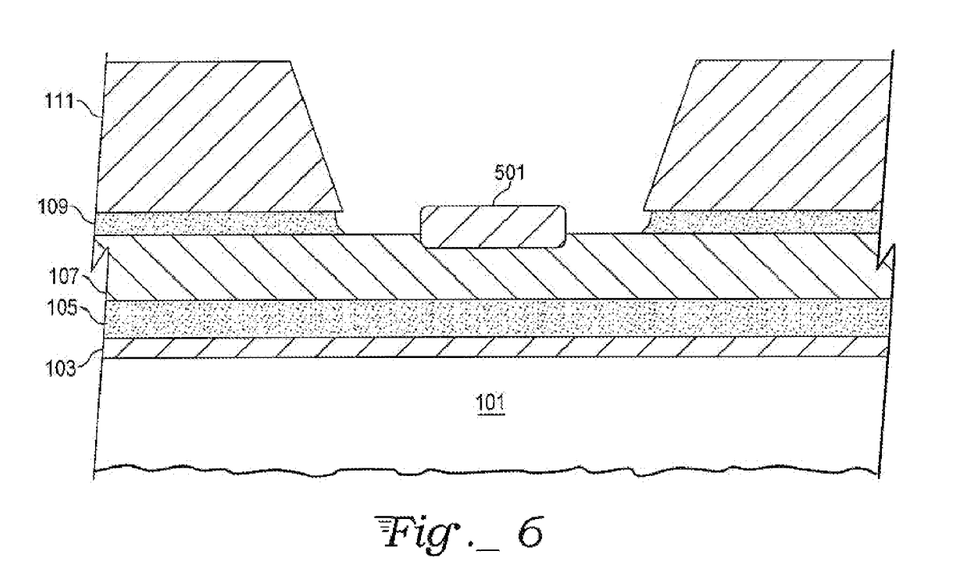
FIG. 6 shows the device structure of FIG. 5 with the etched nitride layer removed.
Figure 7:
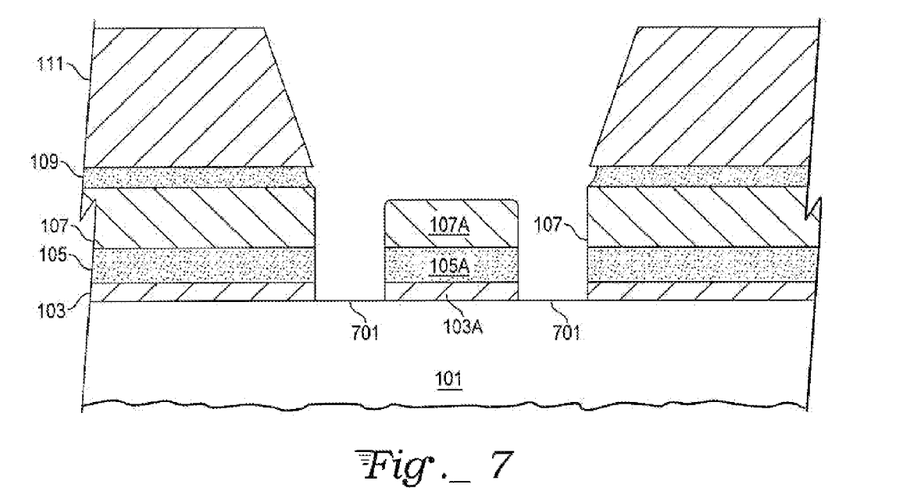
FIG. 7 shows etched films defining an etched poly slot.

With reference to FIG. 7, after removing the etched nitride layer 401, the first three film layers surrounding the thermally grown oxide 501 of FIG. 6 are anisotropically etched (e.g., by RIE) to form a poly plug slot 701. The thermally grown oxide 501 (not shown in FIG. 7) has also been etched away (either through the anisotropic etch process or through a separate wet-etch or dry-etch process). The poly plug slot forms a via for a transistor base contact formed later in the process flow.

Figure 8:
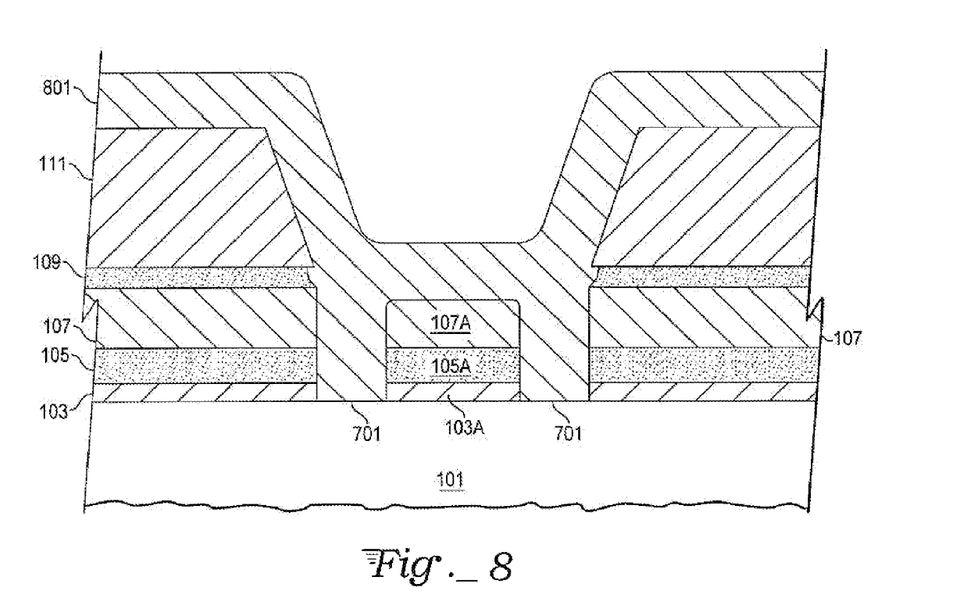
FIG. 8 shows a conformally deposited poly plug layer filling the poly plug slot of FIG. 7 with a doped polycrystalline silicon.
Figure 9:
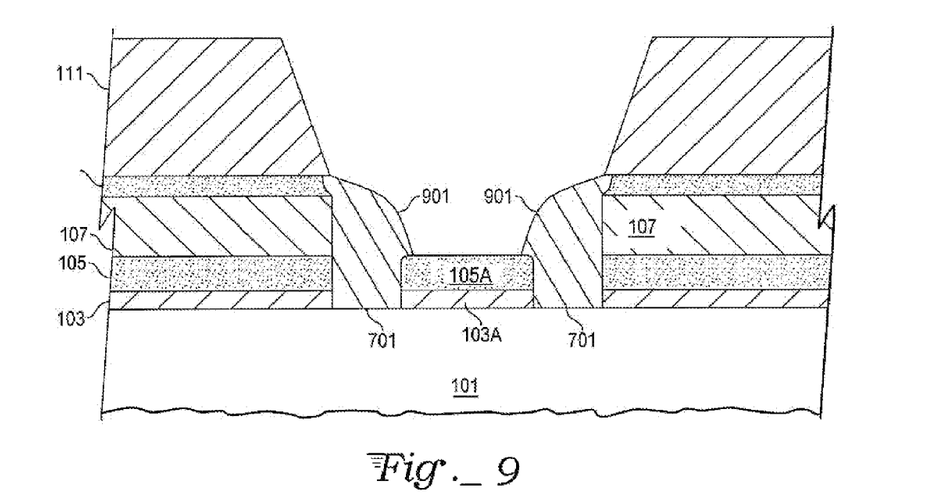
FIG. 9 shows the poly plug layer of FIG. 8 anisotropically etched to form an etched poly plug.

FIG. 8 shows a conformally deposited poly plug layer 801 filling the poly plug slot 701 with a doped polycrystalline silicon. The poly plug layer 801 is then anisotropically etched (FIG. 9) with an over etch through a central portion of the first poly layer 107A (FIG. 8) and into a central portion of the underlying first nitride layer 105A. This anisotropic etch step also forms an etched poly plug 901.

Figure 10:
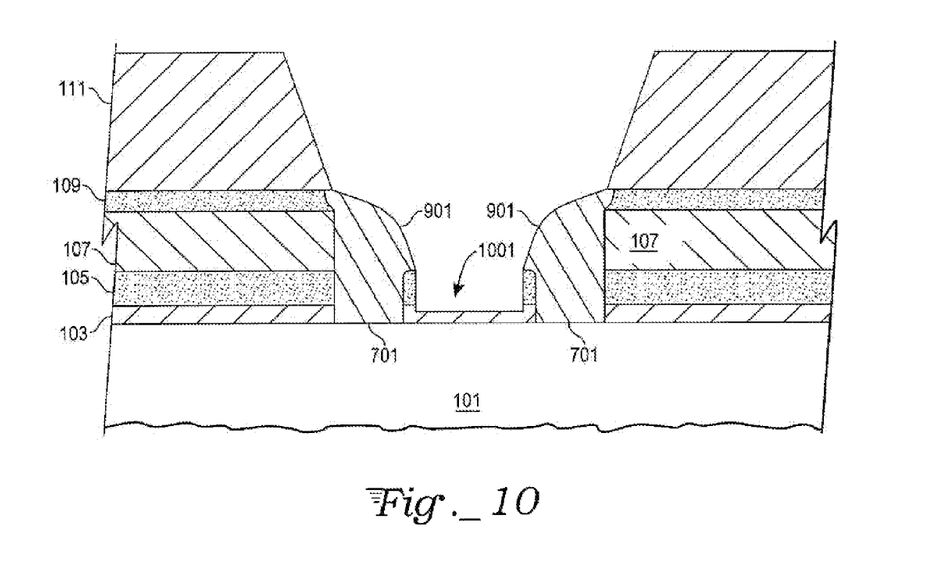
FIG. 10 shows an emitter window formed by etching through a central portion of a first nitride layer first shown in FIG. 1.

With reference to FIG. 10, an emitter window 1001 is formed by etching through the central portion of the first nitride layer 105A. A central portion of the underlying pad oxide 103A may also be partially etched in this nitride etch step. Typically, a high selectivity (nitride to silicon dioxide) etchant will be used during this etch step, thereby minimizing etching the central portion of the pad oxide 103A.

Figure 11:
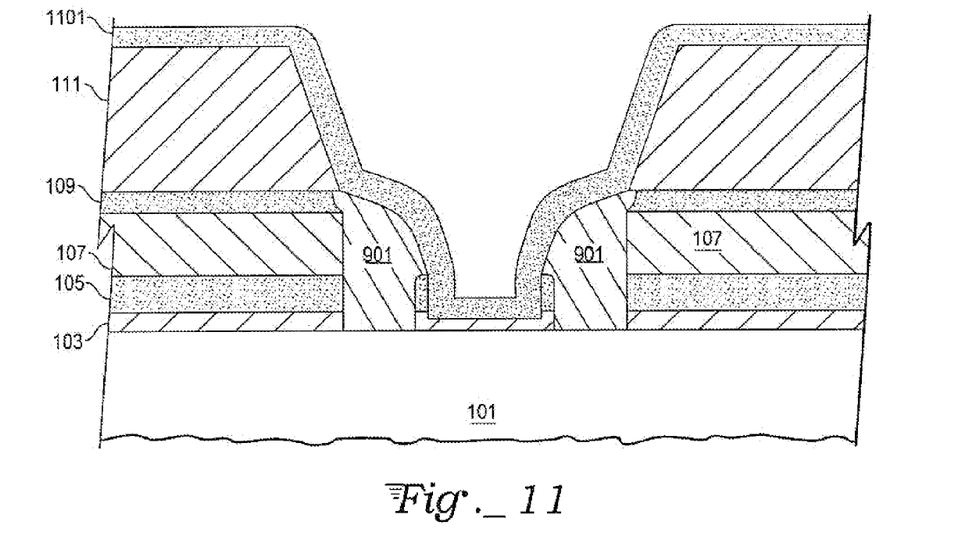
FIG. 11 shows a nitride layer conformally deposited into the emitter window of FIG. 10.

FIG. 11 shows a fourth nitride layer 1101 conformally deposited into the emitter window and surrounding areas. In an exemplary embodiment, the fourth nitride layer 1101 is an LPCVD nitride approximately 1000 Å thick. The fourth nitride layer 1101 forms a dielectric separation between the etched poly plug 901 and an ensuing polysilicon structure.

Figure 12:
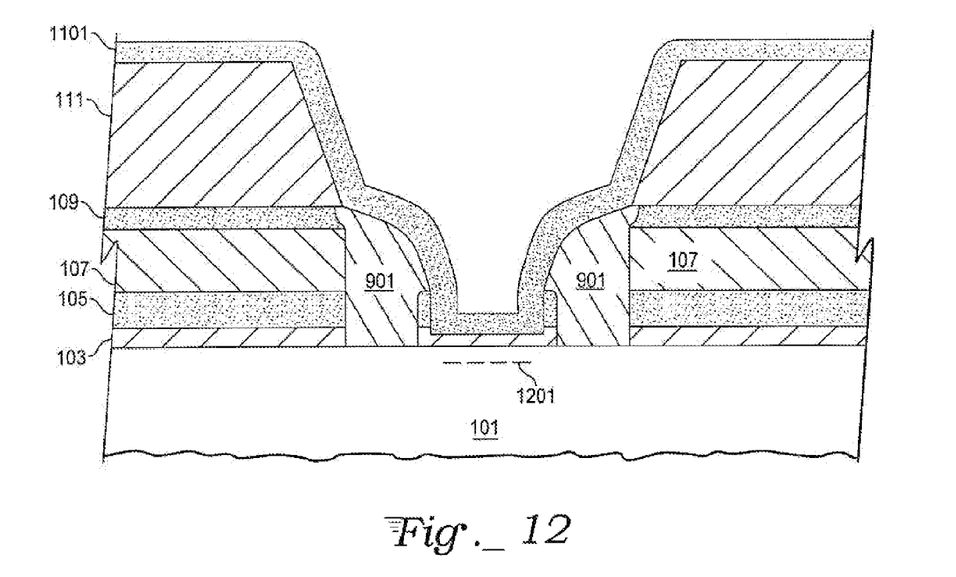
FIG. 12 shows a boron diffusion through the nitride layer of FIG. 11.

With reference to FIG. 12, boron is diffused through the fourth nitride layer 1101 and any remaining portion of the underlying pad oxide 103A and forms a boron implant 1201. The boron implant 1201 will serve as an active base region. A boron dosage level is chosen to provide the desired device characteristics.

Figure 13:
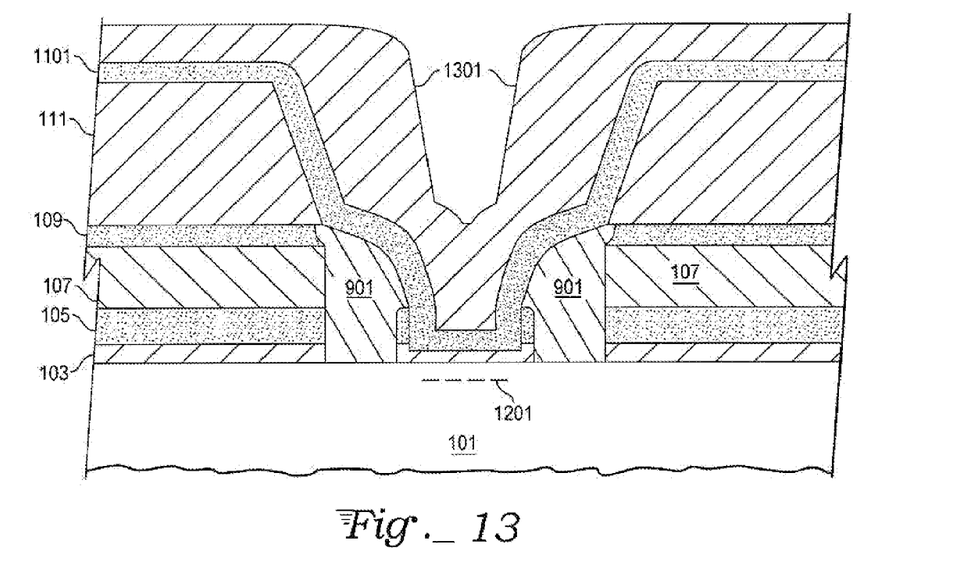
FIG. 13 shows a deposited conformal oxide spacer deposited over the nitride layer of FIG. 12.

FIG. 13 shows a deposited conformal oxide spacer 1301. The oxide spacer 1301 defines a width of a nitride "boot" (described infra). The nitride boot allows feature sizes in general, and the emitter-base contact region in particular, to be formed smaller than conventional photolithographic techniques allow. The oxide spacer 1301 additionally provides for self-alignment of the base-emitter region. In an exemplary embodiment, the oxide spacer 1301 is deposited using LPCVD techniques, although other deposition techniques may be used as well. Alternatively, the oxide spacer 1301 is formed using polycrystalline silicon instead of oxide.

Figure 14:
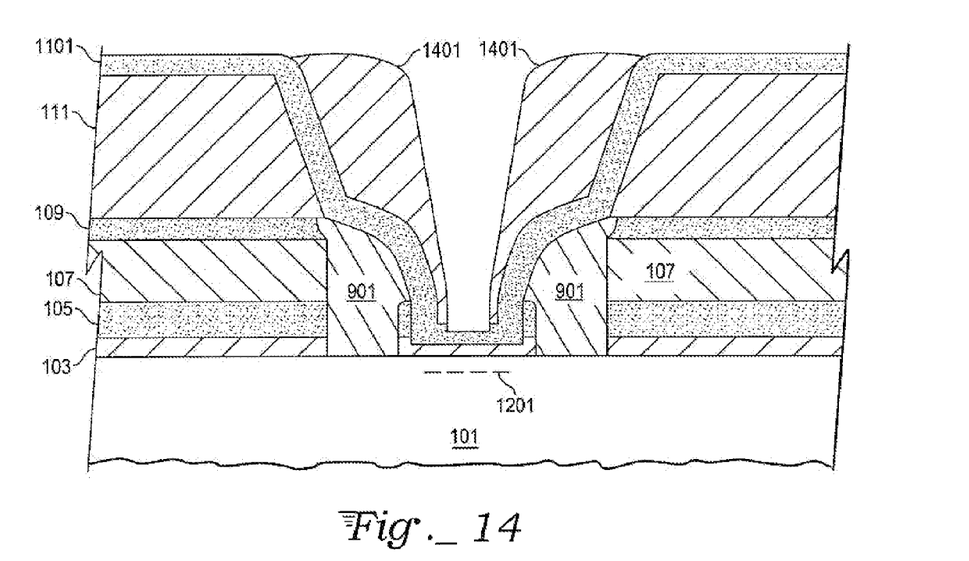
FIG. 14 shows the oxide spacer of FIG. 13 after etching.

FIG. 14 shows an exemplary etched oxide spacer 1401. The etched oxide spacer 1401 is achieved by anisotropic etching (e.g., an RIE process) of the oxide spacer 1301. In the anisotropic etch process, oxide from the "horizontal" surfaces are etched away. The anisotropic etch, combined with the thickness of the etched oxide spacer 1401 determine a width of an emitter opening.

Figure 15:
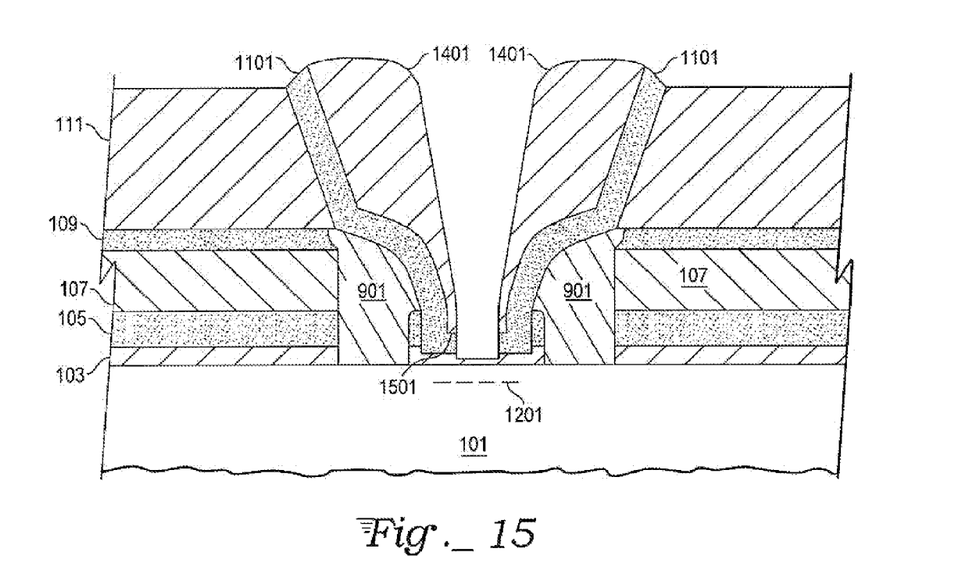
FIG. 15 shows the emitter window of FIG. 10 opened further by anisotropic etching of the nitride layer of FIG. 11.

With reference to FIG. 15, the emitter window 1001 (FIG. 10) is opened further through the use of an anisotropic etch of the fourth nitride layer 1101. An RIE process is effective at removing portions of the fourth nitride layer 1101. A bottom portion of the emitter window 1001 and all nitride on a top portion of the device structure are removed. Since a nitride thickness on the top portion of the device structure is roughly the same as a thickness of the nitride in a bottom portion of the emitter window 1001, good endpoint control is achieved through selective etching techniques, described supra.

With further reference to FIG. 15, the RIE process described above also produces a radially inward projecting boot shape 1501 which defines an emitter contact window by non-photolithographic mean. Since the boot tip is formed through deposition and etching techniques, the emitter window is automatically aligned (i.e., self-aligned) with an underlying base region (described infra). Therefore, level-to-level alignment issues with multiple masks are eliminated. Additionally, feature sizes are also determined by deposition and etching techniques and can be far smaller than features defined by photolithography. Consequently, photolithography of small features is eliminated.

Figure 16:
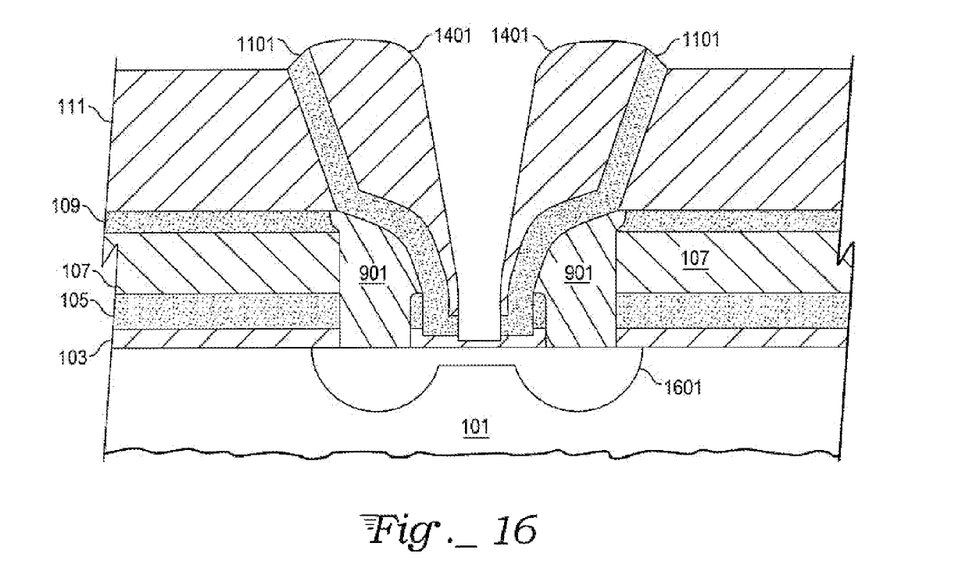
FIG. 16 shows a toroidal-like topology formed from a redistributed dopant from the poly plug of FIG. 9 formed during an implant anneal.

In FIG. 16, the boron implant 1201 in the intrinsic base is annealed. Additionally, boron from doped base poly is redistributed from poly plug 901 into the underlying base structure 101. This boron anneal step creates a redistributed boron implant 1601 with a toroidal-like topology underlying the poly plug 901. The topology of the redistributed boron implant 1601 produces an inherently low junction capacitance, thereby increasing device speed. Further, this unique topology reduces or eliminates the absorption of current through recombination at a boundary surface, resulting in a reduction of the dependence of the current amplification factor on electric current.

Figure 17:
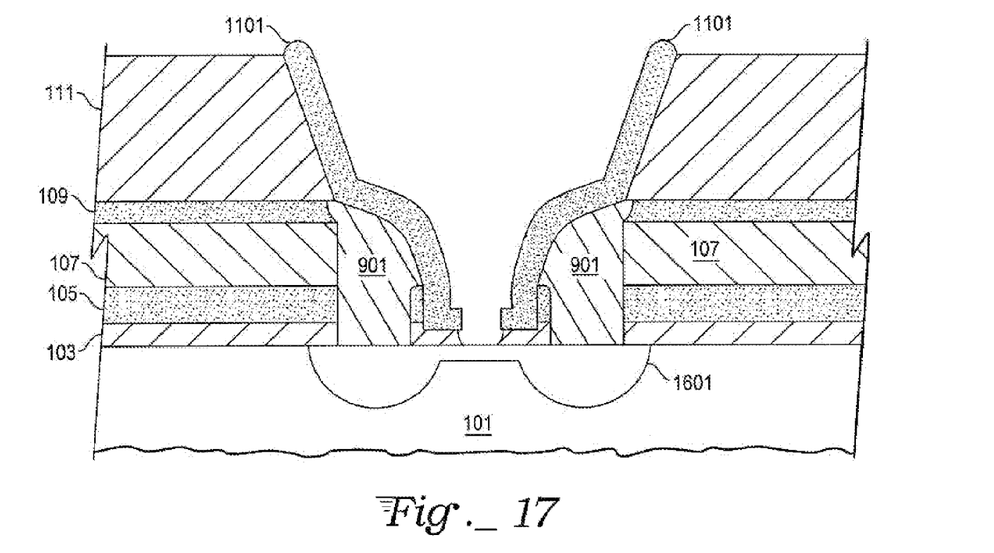
FIG. 17 shows electronic device structure after an etch of thee oxide spacer of FIG. 14.

FIG. 17 shows the device structure after an oxide wet etch. In one embodiment, a timed, wet etch process removes residual oxide from the bottom of the emitter window 1001 and also removes all or part of the etched oxide spacer 1401 (FIG. 14). The etch process also reduce a thickness of the isolation oxide 111. Removal of only part of the etched oxide spacer 1401 will not affect final device performance.

Figure 18:
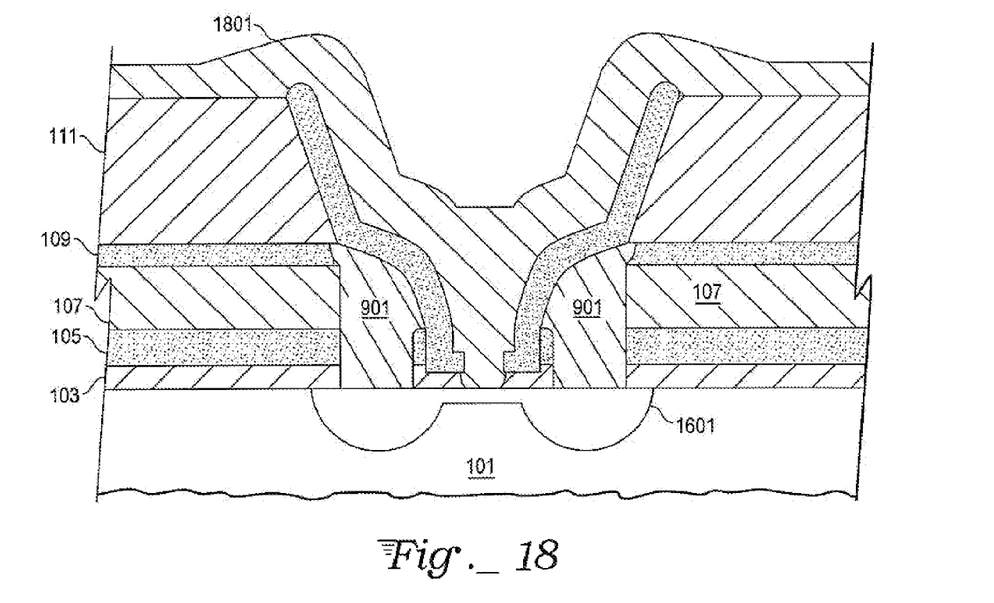
FIG. 18 shows the electronic device structure of FIG. 17 after a ramped poly emitter is conformally applied.

With reference to FIG. 18, a ramped emitter poly layer 1801 is conformally applied over a remaining portion of the device structure. Precautions are taken to minimize or eliminate any native oxide growth on the bottom of the emitter window 1001. Techniques to minimize native oxide growth from silicon are well known in the art and will not be discussed herein.

In an exemplary embodiment following deposition of the ramped emitter poly layer 1801, techniques well known to a skilled artisan are completed to form, for example, collector definition and implants, and metallization steps to complete the semiconductor device.

To facilitate an understanding of the present invention, a process and arrangement for forming a vertical bipolar transistor, particularly a vertical npn transistor on a p-type substrate has been discussed herein. However, the invented process and arrangements of layers and regions described herein are also useful for forming a wide range of other device types and structures having utility as individual devices or in combinations.

For example, although an embodiment depicts formation of an npn bipolar transistor base-emitter junction, a skilled artisan will recognize that the present invention is readily adaptable to a pnp bipolar transistor or to a gate-source junction of a field effect transistor. Additionally, many industries allied with the semiconductor industry could make use of this technique. For example, a thin-film head (TFH) process in the data storage industry or an active matrix liquid crystal display (AMLCD) in the flat panel display industry could readily make use of the processes and techniques described herein. The term "semiconductor" should be recognized as including the aforementioned and related industries.

Additionally, although process steps and techniques are shown and described in detail, a skilled artisan will recognize that other techniques and methods may be utilized which are still included within the scope of the appended claims. For example, there are frequently several techniques used for depositing a film layer (e.g., chemical vapor deposition, plasma-enhanced vapor deposition, epitaxy, atomic layer deposition, etc.). Although not all techniques are amenable to all film types described herein, one skilled in the art will recognize that multiple methods for depositing a given layer and/or film type may be used.

What is claimed is:

1. A method of fabricating a p-n junction in an electronic device comprising:
    forming a slot region for a doped polycrystalline semiconductor plug material within an outer periphery of an etched window region, said window region formed by etching a film stack residing on a topmost surface of a semiconductor substrate, said substrate having a first conductivity type;
    filling said slot region with said polycrystalline semiconductor plug material;
    depositing a dielectric separation layer over said polycrystalline semiconductor plug material and on an uppermost surface of said film stack;
    forming a dopant region in an area of said substrate located within a region circumscribed by said slot region;
    depositing a spacer over said dielectric separation layer;
    etching said spacer and said dielectric separation layer anisotropically to form a dielectric boot shape extending radially inward on a lower edge of said dielectric separation layer, said lower edge being a portion of said dielectric separation layer proximal to said substrate;
    redistributing a dopant from said polycrystalline semiconductor plug into said substrate;
    etching through any remaining film layers within a region substantially circumscribed by said dielectric boot to said topmost surface of said substrate; and
    depositing an emitter polycrystalline semiconductor layer over said topmost surface of said substrate.

2. The method of claim 1 wherein said film stack is comprised of a first oxide layer, a first nitride layer, a first polysilicon layer, a second nitride layer, and an isolation oxide.

3. The method of claim 1 wherein the spacer is comprised of oxide.

4. The method of claim 1 wherein the spacer is comprised of polycrystalline silicon.

5. The method of claim 1 wherein the step of filling said slot region with said polycrystalline semiconductor plug material is achieved by depositing a conformal polycrystalline semiconductor plug material and anisotropically etching said polycrystalline semiconductor plug material prior to depositing a dielectric separation layer.

6. The method of claim 1 wherein said step of redistributing a dopant from said polycrystalline semiconductor plug into said substrate is achieved by an anneal operation.

7. The method of claim 1 wherein said step of redistributing a dopant from said polycrystalline semiconductor plug into said substrate results in a dopant concentration having a toroidal-like topology.

8. A method of fabricating an electronic device comprising:
    forming a slot region for a plug material within an outer periphery of an etched window region, said window region formed by etching a film stack residing on a topmost surface of a semiconductor substrate, said substrate having a first conductivity type;
    filling said slot region with said plug material;
    depositing a dielectric separation layer over said plug material and on an uppermost surface of said film stack;
    forming a dopant region in an area of said substrate located within a region circumscribed by said slot region;
    depositing a spacer over said dielectric separation layer; and
    etching said spacer and said dielectric separation layer anisotropically to form a dielectric boot shape extending radially inward on a lower edge of said dielectric separation layer, said lower edge being a portion of said dielectric separation layer proximal to said substrate.

9. The method of claim 8 wherein the step of filling said slot region with said plug material is achieved by depositing a conformal polycrystalline semiconductor plug material and anisotropically etching said polycrystalline semiconductor plug material prior to depositing a dielectric separation layer.

10. The method of claim 8 further comprising:
    redistributing a dopant from said plug material into said substrate;
    etching through any remaining film layers within a region substantially circumscribed by said dielectric boot to said topmost surface of said substrate; and
    depositing an emitter polycrystalline semiconductor layer over said topmost surface of said substrate.

11. The method of claim 10 wherein said step of redistributing a dopant from said plug material into said substrate is achieved by an anneal operation.

12. The method of claim 10 wherein said step of redistributing a dopant from said plug material into said substrate results in a dopant concentration having a toroidal-like topology.

* * * * *

UNITED STATES PATENT AND TRADEMARK OFFICE
CERTIFICATE OF CORRECTION

PATENT NO. : 7,338,875 B2 Page 1 of 1
APPLICATION NO. : 11/539797
DATED : March 4, 2008
INVENTOR(S) : Lojek It is certified that error appears in the above-identified patent and that said Letters Patent is hereby corrected as shown below:

In column 1, line 62, delete "witch" and insert -- with --, therefor.

In column 2, line 25, before "achieve" insert -- to --.

In column 3, line 1, after "photolithography" insert -- , --.

In column 3, line 32, after "aligned" delete ",".

In column 3, line 40, delete "at" and insert -- of --, therefor.

In column 4, line 38, delete "thee" and insert -- the --, therefor.

In column 5, line 17, delete "511" and insert -- 501 --, therefor.

In column 6, line 21, after "techniques" delete ",".

In column 6, line 26, delete "mean." and insert -- means. --, therefor.

Signed and Sealed this

First Day of July, 2008

JON W. DUDAS
*Director of the United States Patent and Trademark Office*